US009654066B2

(12) United States Patent
Leong et al.

(10) Patent No.: US 9,654,066 B2
(45) Date of Patent: May 16, 2017

(54) COMMON-SOURCE POWER AMPLIFIERS

(71) Applicant: Marvell World Trade Ltd., St. Michael (BB)

(72) Inventors: Poh Boon Leong, Cupertino, CA (US); Sehat Sutardja, Los Altos Hills, CA (US)

(73) Assignee: Marvell World Trade LTD., St. Michael (BB)

( * ) Notice: Subject to any disclaimer, the term of this patent is extended or adjusted under 35 U.S.C. 154(b) by 0 days.

(21) Appl. No.: 14/718,754

(22) Filed: May 21, 2015

(65) Prior Publication Data

US 2015/0349732 A1 Dec. 3, 2015

Related U.S. Application Data

(60) Provisional application No. 62/030,876, filed on Jul. 30, 2014, provisional application No. 62/004,464, filed on May 29, 2014.

(51) Int. Cl.
  *H03F 3/45* (2006.01)
  *H03F 3/21* (2006.01)
  (Continued)

(52) U.S. Cl.
  CPC .......... *H03F 3/211* (2013.01); *H03F 1/0205* (2013.01); *H03F 1/565* (2013.01); *H03F 3/193* (2013.01);
  (Continued)

(58) Field of Classification Search
  CPC ........................................................ H03F 3/45
  (Continued)

(56) References Cited

U.S. PATENT DOCUMENTS 6,426,680 B1 7/2002 Duncan et al.
7,154,332 B2 12/2006 Tsuchi
(Continued)

FOREIGN PATENT DOCUMENTS

JP  2005057744 A   3/2005
JP  2011250084 A   12/2011
(Continued)

OTHER PUBLICATIONS

International Search Report and Written Opinion for PCT/US2015/032214, filed May 22, 2015.
(Continued)

*Primary Examiner* — Patricia T Nguyen

(57) ABSTRACT

A system includes a first amplifier stage and a second amplifier stage. The first amplifier stage is configured to amplify an input signal and generate first output signals. The first amplifier stage includes a common-source differential amplifier. The common-source differential amplifier includes a plurality of metal-oxide semiconductor field-effect transistors (MOSFETs) having source terminals connected to a common potential. The second amplifier stage includes a first differential amplifier and a second differential amplifier configured to respectively generate first and second differential outputs based on the first output signals. Each of the first and second differential amplifiers includes a plurality of MOSFETs having source terminals connected to the common potential via a respective balun.

14 Claims, 13 Drawing Sheets

(51) Int. Cl.
  *H03F 1/56* (2006.01)
  *H03F 3/193* (2006.01)
  *H03F 1/02* (2006.01)

(52) U.S. Cl.
  CPC ..... *H03F 3/45179* (2013.01); *H03F 3/45183* (2013.01); *H03F 3/45475* (2013.01); *H03F 2200/408* (2013.01); *H03F 2200/451* (2013.01); *H03F 2200/513* (2013.01); *H03F 2203/21106* (2013.01); *H03F 2203/21139* (2013.01); *H03F 2203/45032* (2013.01); *H03F 2203/45134* (2013.01); *H03F 2203/45138* (2013.01); *H03F 2203/45481* (2013.01); *H03F 2203/45621* (2013.01); *H03F 2203/45731* (2013.01)

(58) Field of Classification Search
  USPC .......................................... 330/253, 310, 302
  See application file for complete search history.

(56) References Cited

U.S. PATENT DOCUMENTS

| | | | |
|---|---|---|---|
| 7,642,858 | B2 | 1/2010 | Lee et al. |
| 7,756,486 | B1 | 7/2010 | Tan et al. |
| 8,433,259 | B2 | 4/2013 | Kuroki |
| 2006/0091958 | A1 | 5/2006 | Bhatti et al. |
| 2006/0197597 | A1 | 9/2006 | Ananth |
| 2007/0176679 | A1 | 8/2007 | Kluge |
| 2009/0153244 | A1* | 6/2009 | Cabanillas ............ H03F 1/3205 330/253 |
| 2009/0189697 | A1 | 7/2009 | Zafonte et al. |
| 2009/0195310 | A1* | 8/2009 | Holenstein ............ H03F 1/3205 330/254 |
| 2012/0064836 | A1 | 3/2012 | Bauwelinck et al. |
| 2012/0161880 | A1* | 6/2012 | Sutardja ................. H03F 1/223 330/310 |
| 2012/0235746 | A1 | 9/2012 | Li et al. |
| 2012/0274403 | A1* | 11/2012 | Kim ....................... H03F 1/223 330/278 |
| 2012/0293265 | A1* | 11/2012 | Heikkinen .............. H03F 1/565 330/291 |
| 2014/0203874 | A1* | 7/2014 | Sutardja ................. H03F 1/223 330/225 |
| 2015/0372645 | A1 | 12/2015 | Banerjee et al. |

FOREIGN PATENT DOCUMENTS

| | | |
|---|---|---|
| KR | 20080098268 A | 11/2008 |
| WO | WO-0223716 A2 | 3/2002 |
| WO | WO-2012088520 A2 | 6/2012 |

OTHER PUBLICATIONS

U.S. Appl. No. 61/974,941, filed Apr. 3, 2014, Cai.
U.S. Appl. No. 14/676,748, Li Cai.
International Search Report and Written Opinion for PCT/US2015/023947, filed Apr. 1, 2015.
Invitation to Pay Addition Fees for PCT/US2015/032214 dated Sep. 4, 2015.

* cited by examiner

COMMON-SOURCE POWER AMPLIFIERS

CROSS-REFERENCE TO RELATED APPLICATIONS

This application claims the benefit of U.S. Provisional Application No. 62/030,876, filed on Jul. 30, 2014 and U.S. Provisional Application No. 62/004,464 filed on May 29, 2014. The entire disclosures of the applications referenced above are incorporated herein by reference.

This application is related to U.S. Provisional Application No. 61/974,941, filed on Apr. 3, 2014. The entire disclosure of the application referenced above is incorporated herein by reference.

FIELD

The present disclosure relates to power amplifiers.

BACKGROUND

Power amplifiers are used in a variety of circuits. For example, power amplifiers are used in transmitters of wireless communication devices. Linearity, output voltage swing, and component size are some of the important considerations in designing power amplifiers.

SUMMARY

A system comprises a first amplifier stage and a second amplifier stage. The first amplifier stage is configured to amplify an input signal and generate first output signals. The first amplifier stage includes a common-source differential amplifier. The common-source differential amplifier includes a plurality of metal-oxide semiconductor field-effect transistors (MOSFETs) having source terminals connected to a common potential. The second amplifier stage includes a first differential amplifier and a second differential amplifier configured to respectively generate first and second differential outputs based on the first output signals. Each of the first and second differential amplifiers includes a plurality of MOSFETs having source terminals connected to the common potential via a respective balun.

In another feature, the system further comprises a combiner configured to combine the first and second differential outputs of the first and second differential amplifiers to generate an output.

In other features, the first and second differential amplifiers receive a supply voltage, and the first and second differential outputs of the first and second differential amplifiers have an amplitude greater than twice the supply voltage.

In other features, the MOSFETs of the common-source differential amplifier of the first amplifier stage include N MOSFETs, the MOSFETs of the first differential amplifier of the second amplifier stage include N MOSFETs, and the MOSFETs of the second differential amplifier of the second amplifier stage include P MOSFETs.

In another feature, the system further comprises a third amplifier stage configured to receive the first output signals. The third amplifier stage includes a third differential amplifier and a fourth differential amplifier configured to respectively generate third and fourth differential outputs. Each of the third and fourth differential amplifiers includes a plurality of MOSFETs having source terminals connected to the common potential. The third and fourth differential outputs are respectively output to the first and second differential amplifiers of the second amplifier stage.

In other features, the MOSFETs of the common-source differential amplifier of the first amplifier stage include N MOSFETs, the MOSFETs of the first differential amplifier of the second amplifier stage and the MOSFETs of the third differential amplifier of the third amplifier stage include N MOSFETs, and the MOSFETs of the second differential amplifier of the second amplifier stage and the MOSFETs of the fourth differential amplifier of the third amplifier stage include P MOSFETs.

In other features, the MOSFETs of the common-source differential amplifier of the first amplifier stage include N MOSFETs, the MOSFETs of the first and second differential amplifiers of the second amplifier stage and the MOSFETs of the third differential amplifier of the third amplifier stage include N MOSFETs, and the MOSFETs of the fourth differential amplifier of the third amplifier stage include P MOSFETs.

In another feature, the system further comprises a third amplifier stage configured to receive the first output signals and generate second output signals. The third amplifier stage includes a second common-source differential amplifier. The second common-source differential amplifier includes a plurality of MOSFETs having source terminals connected to the common potential and having a size greater than the plurality of MOSFETs of the first amplifier stage. The second output signals are output to the first and second differential amplifiers of the second amplifier stage.

In other features, the MOSFETs of the first and third amplifier stages include N MOSFETs, the MOSFETs of the first differential amplifier of the second amplifier stage include N MOSFETs, and the MOSFETs of the second differential amplifier of the second amplifier stage include P MOSFETs.

In another feature, the system further comprises a combiner including first and second pairs of inductances connected in series to each other. The first pair of inductances is inductively coupled to the first differential output of the first differential amplifier of the second amplifier stage. The second pair of inductances is inductively coupled to the second differential output of the second differential amplifier of the second amplifier stage.

In another feature, the system further comprises a combiner including first and second pairs of inductances. The inductances of the first pair are connected in series to each other. The inductances of the second pair are connected in series to each other. The first pair of inductances is connected in parallel to the second pair of inductances. The first and second pairs of inductances are respectively inductively coupled to the first and second differential outputs of the first and second differential amplifiers of the second amplifier stage.

In still other features, a system comprises a first differential amplifier, a second differential amplifier, a first driver circuit, and a second driver circuit. The first differential amplifier includes a plurality of N metal-oxide semiconductor field-effect transistors (MOSFETs). Source terminals of the N MOSFETs are connected to a common potential via a respective inductance. The second differential amplifier includes a plurality of P metal-oxide semiconductor field-effect transistors (MOSFETs). Source terminals of the P MOSFETs are connected to supply voltage via a respective inductance. The first driver circuit includes a plurality of P MOSFETs configured to generate a plurality of first driver signals that are respectively input to the source terminals of the N MOSFETs of the first differential amplifier. The second driver circuit includes a plurality of N MOSFETs configured to generate a plurality of second driver signals that are respectively input to the source terminals of the P MOSFETs of the second differential amplifier.

In another feature, outputs of the first and second differential amplifiers have an amplitude greater than twice the supply voltage.

In another feature, the system further comprises a combiner including first and second pairs of inductances connected in series to each other. The first pair of inductances is inductively coupled to a first differential output of the first differential amplifier. The second pair of inductances is inductively coupled to a second differential output of the second differential amplifier.

In another feature, the system further comprises a combiner including first and second pairs of inductances. The inductances of the first pair are connected in series to each other. The inductances of the second pair are connected in series to each other. The first pair of inductances is connected in parallel to the second pair of inductances. The first and second pairs of inductances are respectively inductively coupled to the first and second differential outputs of the first and second differential amplifiers.

In still other features, a method comprises generating a first output by amplifying an input using a first common-source amplifier having source terminals connected to a common potential, and generating a second output by amplifying the first output using a second common-source amplifier having source terminals connected to the common potential via a respective balun or active component.

In another feature, an amplitude of the second output is greater than twice a supply voltage of the first and second common-source amplifiers.

In another feature, the method further comprises inductively coupling the second output to a power combiner, and supplying an output of the power combiner to a load.

In another feature, the method further comprises driving the second common-source amplifier using a third common-source amplifier. The third common-source amplifier receives the first output. The third common-source amplifier has source terminals connected to the common potential.

In another feature, the third common-source amplifier includes transistors of size greater than transistors of the first common-source amplifier.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

The present disclosure relates to novel architectural designs for common-source power amplifiers. A common-source power amplifier according to the present disclosure includes a plurality of amplifier stages. A first amplifier stage includes a differential common-source amplifier that amplifies an input signal and that drives a second amplifier stage. The second amplifier stage may include one or more differential common-source amplifiers that further amplify the input signal and that drive a third amplifier stage. The third amplifier stage includes a pair of differential common-source amplifiers that further amplifies the output of the second amplifier stage. The outputs of the third amplifier stage are inductively coupled to a power combiner. The power combiner combines the outputs of the third amplifier stage and delivers the combined output to a load (e.g., an antenna).

The source terminals of metal-oxide semiconductor field-effect transistors (MOSFETs) of the common-source amplifiers in the first and second amplifier stages are directly connected to a common potential (e.g., ground). The source terminals of MOSFETs of the common-source amplifiers in the third amplifier stage are connected to the common potential via respective baluns. The baluns increase the voltage swing of the outputs of the third amplifier stage to greater than twice a supply voltage ($V_{DD}$) of the common-source power amplifier. In some implementations, active components such as MOSFETs are used instead of baluns. These and other aspects of the architectural designs of the common-source power amplifiers according to the present disclosure are described below in detail.

Figure 1:
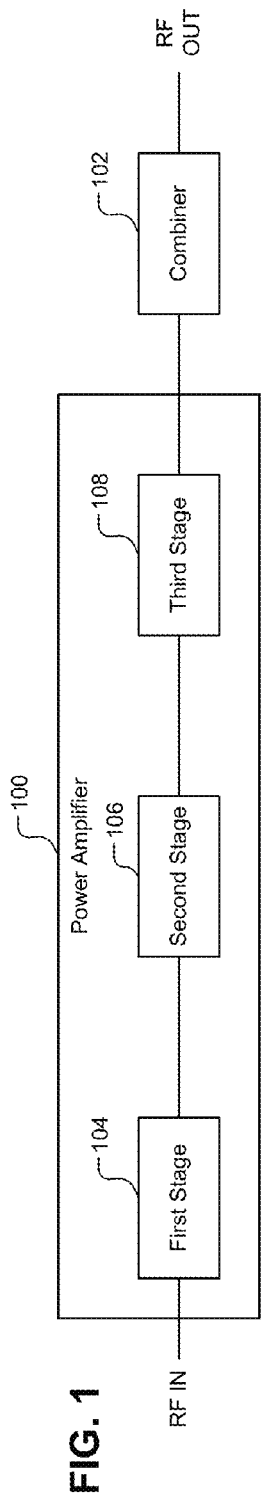
FIG. 1 is a block diagram of a common-source power amplifier and a power combiner according to the present disclosure.

FIG. 1 shows a common-source power amplifier 100 and a power combiner 102 according to the present disclosure. The common-source power amplifier 100 includes a first amplifier stage 104, a second amplifier stage 106, and a third amplifier stage 108. The first amplifier stage 104 receives an input signal that is amplified by the common-source power amplifier 100. The first amplifier stage 104 amplifies the input signal and outputs the amplified signal to the second amplifier stage 106. The first amplifier stage 104 drives the second amplifier stage 106. The second amplifier stage 106 further amplifies the output of the first amplifier stage 104 and outputs a further amplified signal to the third amplifier stage 108. The second amplifier stage 106 drives the third amplifier stage 108. The third amplifier stage 108 further amplifies the output of the second amplifier stage 106 and outputs a further amplified signal. The power combiner 102 combines the outputs of the third amplifier stage 108 and delivers the combined output to a load such as an antenna.

Figure 2:
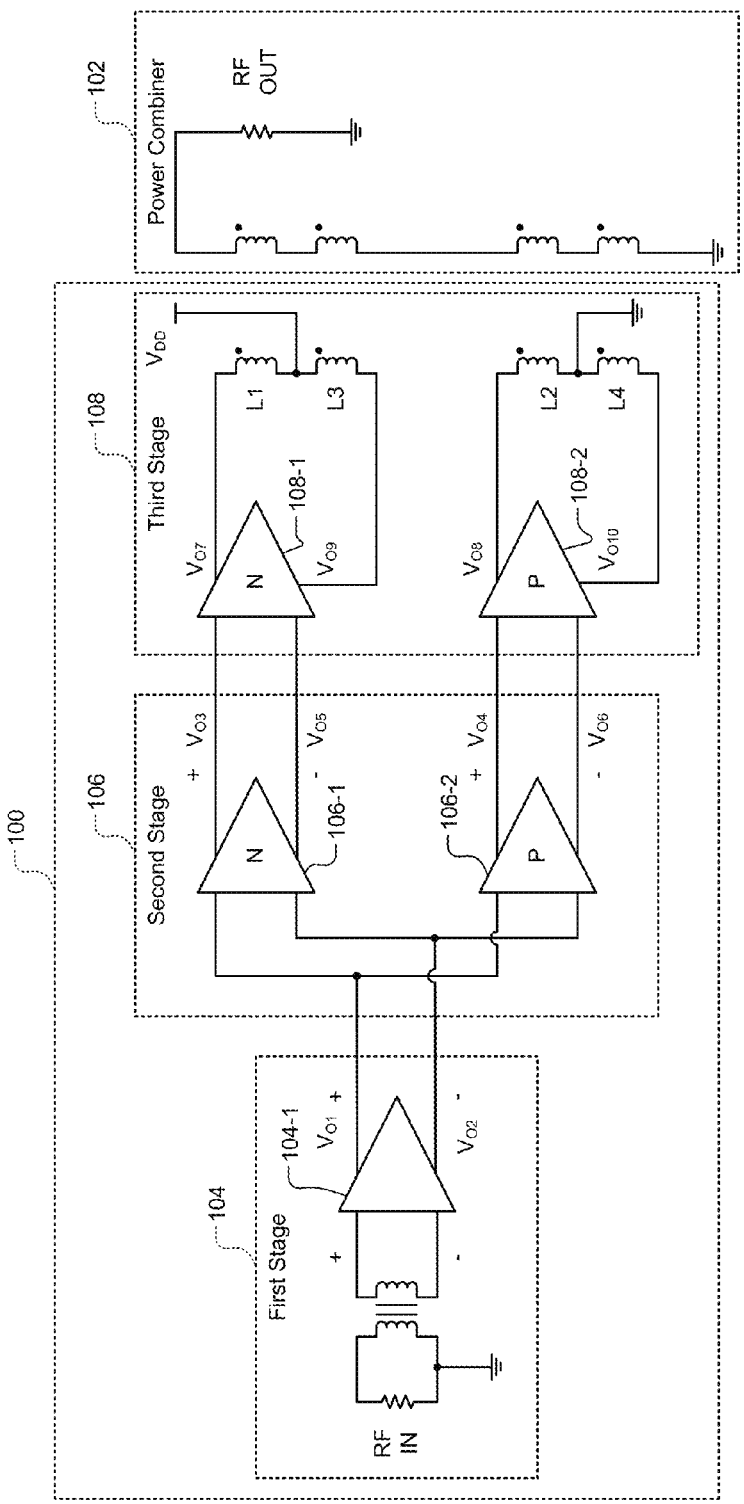
FIG. 2 is a schematic of a first example of the common-source power amplifier and the power combiner of FIG. 1 according to the present disclosure.

FIG. 2 shows the common-source power amplifier 100 and the power combiner 102 in further detail. The first amplifier stage 104 of the common-source power amplifier 100 includes a common-source differential amplifier 104-1. For example only, the common-source differential amplifier 104-1 includes NMOS transistors. The second amplifier stage 106 of the common-source power amplifier 100 includes two common-source differential amplifiers 106-1 and 106-2. For example only, the first and second common-source differential amplifiers 106-1 and 106-2 of the second amplifier stage 106 respectively include NMOS and PMOS transistors. The common-source differential amplifier 104-1 of the first amplifier stage 104 drives each of the first and second common-source differential amplifiers 106-1 and 106-2 of the second amplifier stage 106. The first and second common-source differential amplifiers 106-1 and 106-2 of the second amplifier stage 106 generate respective differential outputs.

The third amplifier stage 108 of the common-source power amplifier 100 includes two common-source differential amplifiers 108-1 and 108-2. For example only, the first and second common-source differential amplifiers 108-1 and 108-2 of the third amplifier stage 108 respectively include NMOS and PMOS transistors. The first and second common-source differential amplifiers 106-1 and 106-2 of the second amplifier stage 106 respectively drive the first and second common-source differential amplifiers 108-1 and 108-2 of the third amplifier stage 108. The first and second common-source differential amplifiers 108-1 and 108-2 of the third amplifier stage 108 generate respective differential outputs. The differential outputs of the first and second common-source differential amplifiers 108-1 and 108-2 of the third amplifier stage 108 are inductively coupled to the power combiner 102. The power combiner 102 combines the differential outputs of the first and second common-source differential amplifiers 108-1 and 108-2 of the third amplifier stage 108 and delivers the combined output to a load such as an antenna.

Figure 3:
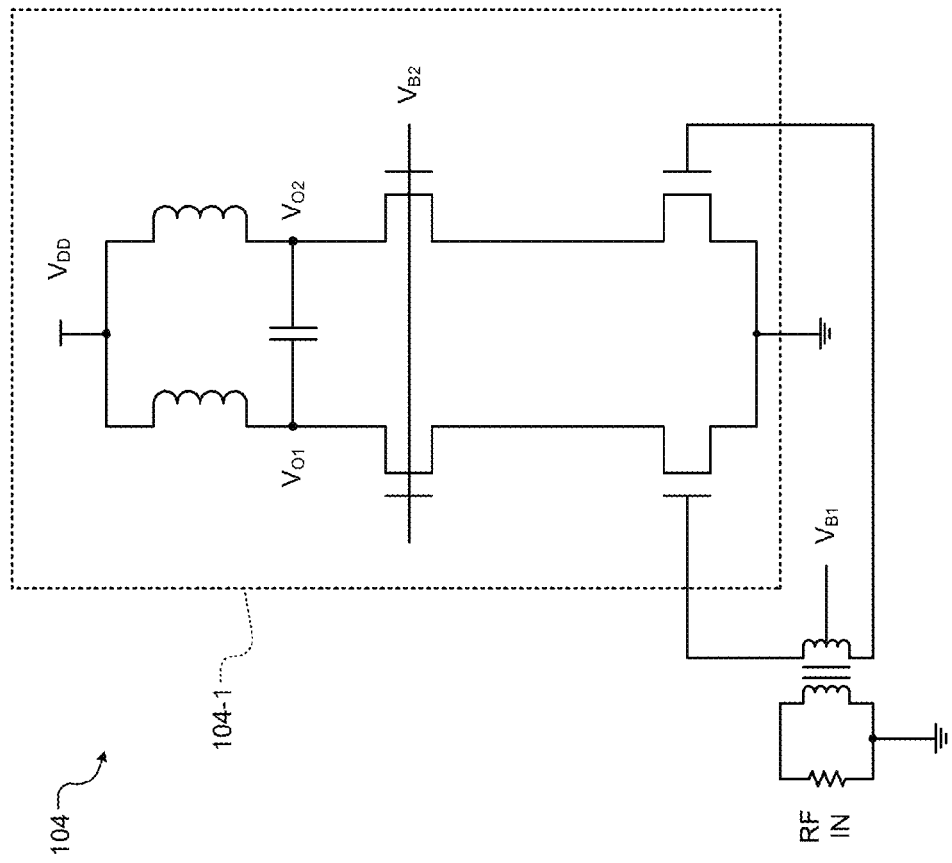
FIG. 3 is a schematic of a first amplifier stage of the common-source power amplifier of FIG. 1 according to the present disclosure.

FIG. 3 shows the first amplifier stage 104 of the common-source power amplifier 100 in further detail. For example only, the common-source differential amplifier 104-1 of the first amplifier stage 104 includes NMOS transistors. The source terminals of the NMOS transistors of the common-source differential amplifier 104-1 of the first amplifier stage 104 are directly connected to a common potential (e.g., ground) as shown. The common-source differential amplifier 104-1 of the first amplifier stage 104 receives an input signal, amplifies the input signal, and generates differential outputs $V_{O1}$ and $V_{O2}$. The differential outputs of the common-source differential amplifier 104-1 of the first amplifier stage 104 drive the common-source differential amplifiers 106-1 and 106-2 of the second amplifier stage 106.

Figure 4:
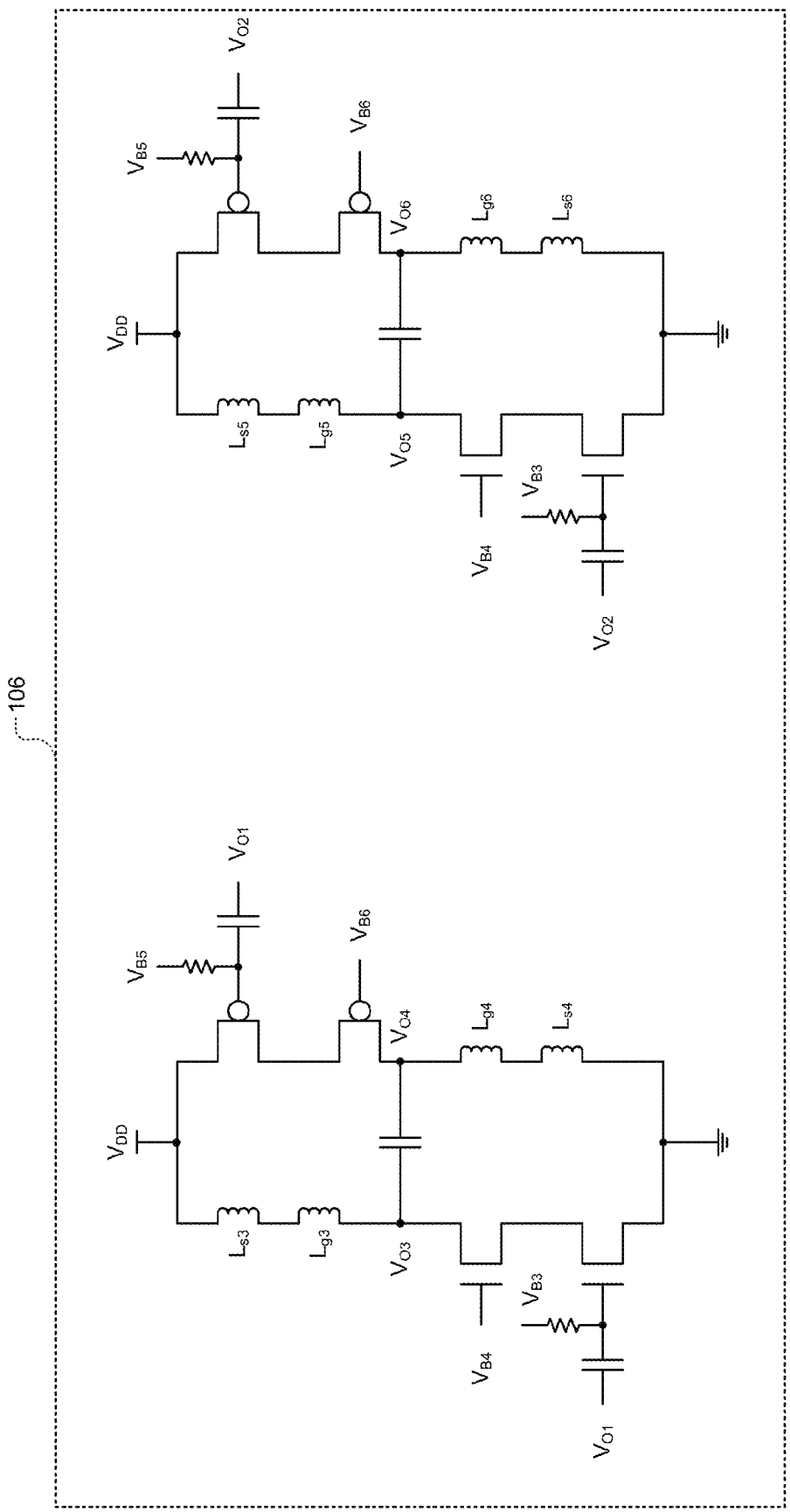
FIG. 4 is a schematic of a second amplifier stage of the common-source power amplifier of FIG. 1 according to the present disclosure.

FIG. 4 shows the first and second common-source differential amplifiers 106-1 and 106-2 of the second amplifier stage 106 in further detail. The source terminals of the NMOS transistors of the first common-source differential amplifier 106-1 of the second amplifier stage 106 are directly connected to a common potential (e.g., ground) as shown. The first and second common-source differential amplifiers 106-1 and 106-2 of the second amplifier stage 106 amplify the differential outputs $V_{O1}$ and $V_{O2}$ of the common-source differential amplifier 104-1 of the first amplifier stage 104. The common-source differential amplifier 106-1 generates differential outputs $V_{O3}$ and $V_{O5}$. The common-source differential amplifier 106-2 generates differential outputs $V_{O4}$ and $V_{O6}$. The differential outputs of the first and second common-source differential amplifiers 106-1 and 106-2 of the second amplifier stage 106 respectively drive the common-source differential amplifiers 108-1 and 108-2 of the third amplifier stage 108.

The output $V_{O3}$ of the first common-source differential amplifier 106-1 is AC coupled to the output $V_{O4}$ of the second common-source differential amplifier 106-2 as shown. The output $V_{O5}$ of the first common-source differential amplifier 106-1 is AC coupled to the output $V_{O6}$ of the second common-source differential amplifier 106-2 as shown. The second amplifier stage 106 increases the linearity of the common-source power amplifier 100 by canceling even harmonics.

Figure 5:
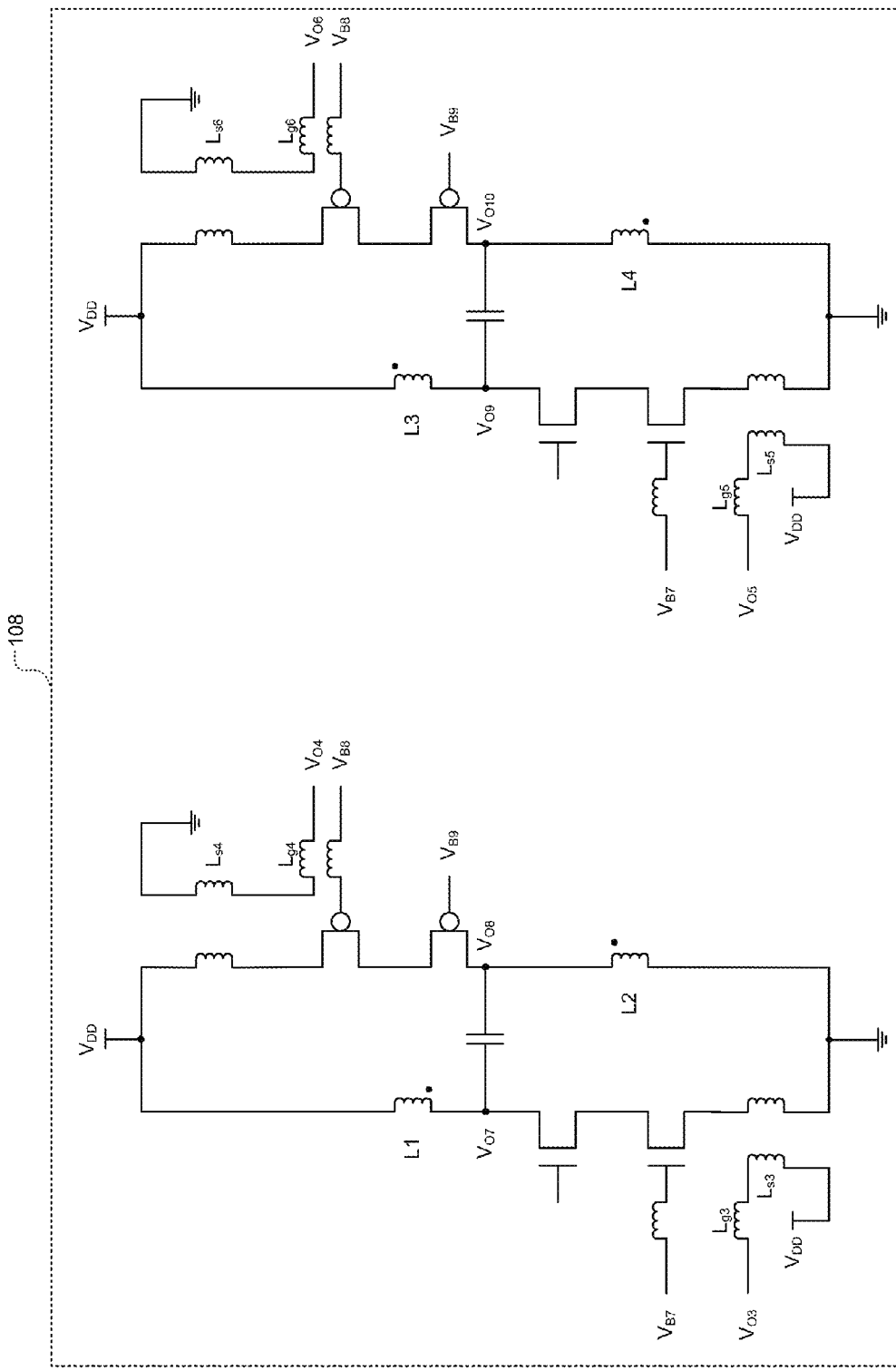
FIG. 5 is a schematic of a third amplifier stage of the common-source power amplifier of FIG. 1 according to the present disclosure.

FIG. 5 shows the first and second common-source differential amplifiers 108-1 and 108-2 of the third amplifier stage 108 in further detail. The source terminals of the NMOS transistors of the first and second common-source differential amplifiers 108-1 and 108-2 of the third amplifier stage 108 are not directly connected to a common potential (e.g., ground). Instead, the source terminals of the NMOS transistors of the first and second common-source differential amplifiers 108-1 and 108-2 of the third amplifier stage 108 are connected to a common potential (e.g., ground) via respective baluns $L_{S3}$ and $L_{S5}$ as shown. Additionally, the source terminals of the PMOS transistors of the first and second common-source differential amplifiers 108-1 and 108-2 of the third amplifier stage 108 are not directly connected to a supply voltage of the common-source power amplifier 100 (e.g., $V_{DD}$). Instead, the source terminals of the PMOS transistors of the first and second common-source differential amplifiers 108-1 and 108-2 of the third amplifier stage 108 are connected to a supply voltage of the common-source power amplifier 100 (e.g., $V_{DD}$) via respective baluns $L_{S4}$ and $L_{S6}$ as shown.

The first common-source differential amplifier 108-1 of the third amplifier stage 108 comprising NMOS transistors amplifies the differential outputs $V_{O3}$ and $V_{O5}$ of the first common-source differential amplifier 106-1 of the second amplifier stage 106. The first common-source differential amplifier 108-1 generates differential outputs $V_{O7}$ and $V_{O9}$. The second common-source differential amplifier 108-2 of the third amplifier stage 108 comprising PMOS transistors amplifies the differential outputs $V_{O4}$ and $V_{O6}$ of the second common-source differential amplifier 106-2 of the second amplifier stage 106. The second common-source differential amplifier 108-2 generates differential outputs $V_{O8}$ and $V_{O10}$. Due to the baluns, the total voltage swing of the outputs of each of the first and second common-source differential amplifiers 108-1 and 108-2 of the third amplifier stage 108 is greater than twice the supply voltage of the common-source power amplifier 100 (i.e., greater than $2V_{DD}$).

Figure 6:
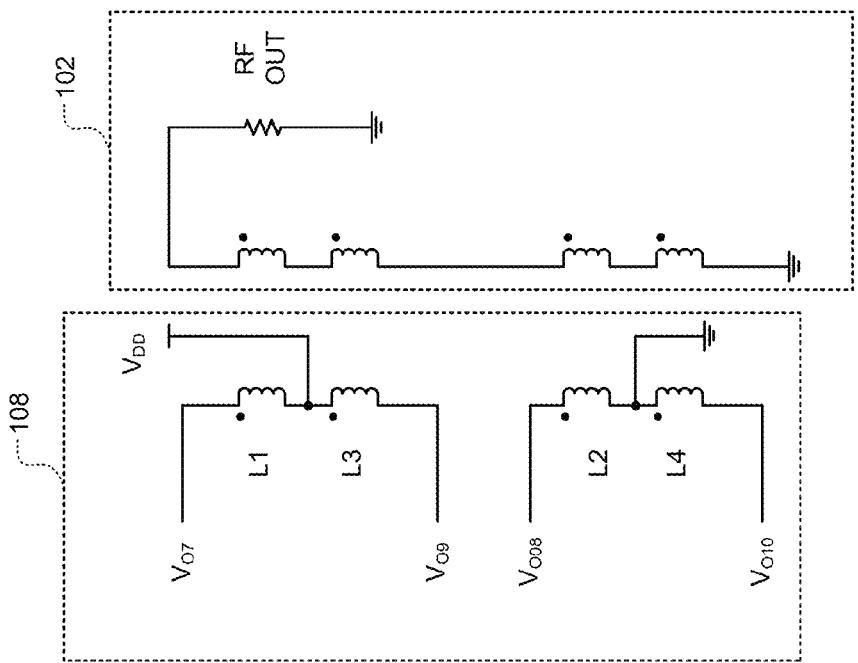
FIG. 6 is a schematic of a series power combiner according to the present disclosure.

FIG. 6 shows an example of the power combiner 102. The example shows a series power combiner 102. The power combiner 102 includes four inductances that are connected in series to each other. The four inductances of the power combiner 102 are connected across (i.e., in parallel to) a load and a common potential (e.g., ground) as shown. As shown, the four inductances of the power combiner 102 are respectively coupled to the four inductances L1 through L4 of the first and second common-source differential amplifiers 108-1 and 108-2 of the third amplifier stage 108 across which the outputs $V_{O7}$ through $V_{O10}$ of the third amplifier stage 108 are taken.

Figure 7:
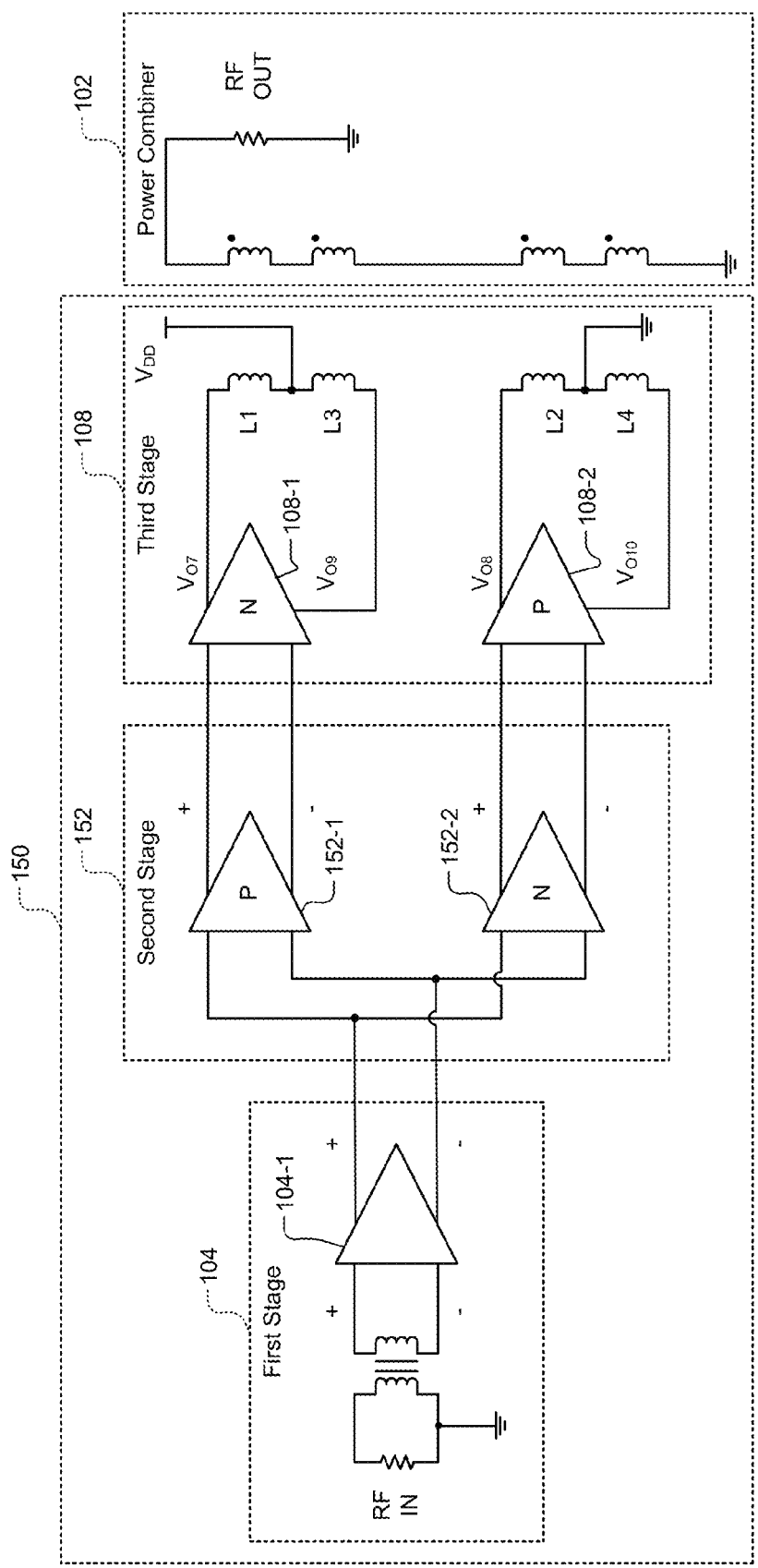
FIG. 7 is a schematic of a second example of the common-source power amplifier and the power combiner of FIG. 1 according to the present disclosure.

FIG. 7 shows a common-source power amplifier 150 with the power combiner 102. The common-source power amplifier 150 includes the first amplifier stage 104, a second amplifier stage 152, and the third amplifier stage 108. The second amplifier stage 152 of the common-source power amplifier 150 includes two common-source differential amplifiers 152-1 and 152-2. For example only, the first and second common-source differential amplifiers 152-1 and 152-2 of the second amplifier stage 152 respectively include PMOS and NMOS transistors. The common-source differential amplifier 104-1 of the first amplifier stage 104 drives each of the first and second common-source differential amplifiers 152-1 and 152-2 of the second amplifier stage 152. The source terminals of the NMOS transistors of the second common-source differential amplifier 152-2 of the second amplifier stage 152 are directly connected to a common potential (e.g., ground). The first and second common-source differential amplifiers 152-1 and 152-2 of the second amplifier stage 152 amplify the differential outputs $V_{O1}$ and $V_{O2}$ of the common-source differential amplifier 104-1 of the first amplifier stage 104. The first and second common-source differential amplifiers 152-1 and 152-2 of the second amplifier stage 152 generate respective differential outputs. The first and second common-source differential amplifiers 152-1 and 152-2 of the second amplifier stage 152 respectively drive the first and second common-source differential amplifiers 108-1 and 108-2 of the third amplifier stage 108. The second amplifier stage 152 of the common-source power amplifier 150 has greater linearity than the second amplifier stage 106 of the common-source power amplifier 100.

Figure 8:
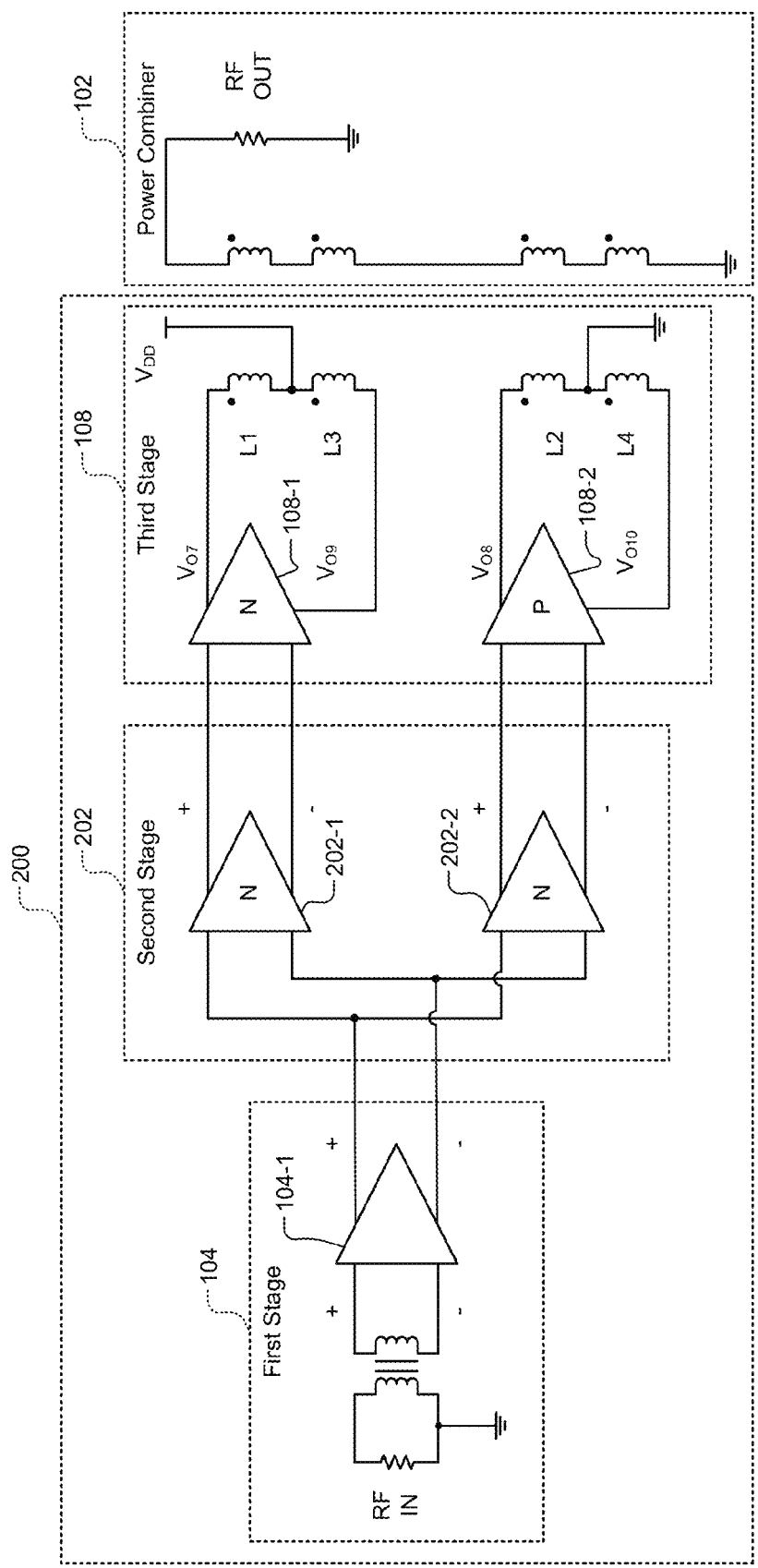
FIG. 8 is a schematic of a third example of the common-source power amplifier and the power combiner of FIG. 1 according to the present disclosure.

FIG. 8 shows a common-source power amplifier 200 with the power combiner 102. The common-source power amplifier 200 includes the first amplifier stage 104, a second amplifier stage 202, and the third amplifier stage 108. The second amplifier stage 202 of the common-source power amplifier 200 includes two common-source differential amplifiers 202-1 and 202-2. For example only, the first and second common-source differential amplifiers 202-1 and 202-2 of the second amplifier stage 202 include NMOS transistors. The common-source differential amplifier 104-1 of the first amplifier stage 104 drives each of the first and second common-source differential amplifiers 202-1 and 202-2 of the second amplifier stage 202. The source terminals of the NMOS transistors of the first and second common-source differential amplifiers 202-1 and 202-2 of the second amplifier stage 202 are directly connected to a common potential (e.g., ground). The first and second common-source differential amplifiers 202-1 and 202-2 of the second amplifier stage 202 amplify the differential outputs $V_{O1}$ and $V_{O2}$ of the common-source differential amplifier 104-1 of the first amplifier stage 104. The first and second common-source differential amplifiers 202-1 and 202-2 of the second amplifier stage 202 generate respective differential outputs. The first and second common-source differential amplifiers 202-1 and 202-2 of the second amplifier stage 202 respectively drive the first and second common-source differential amplifiers 108-1 and 108-2 of the third amplifier stage 108.

The second amplifier stage 202 of the common-source power amplifier 200 has less linearity than the second amplifier stage 106 of the common-source power amplifier 100. However, using all NMOS transistors for the first and second common-source differential amplifiers 202-1 and 202-2 of the second amplifier stage 202 results in significant savings in chip area. Additionally, NMOS transistors are better drivers than PMOS transistors since NMOS transistors have greater transconductance than PMOS transistors.

Figure 9:
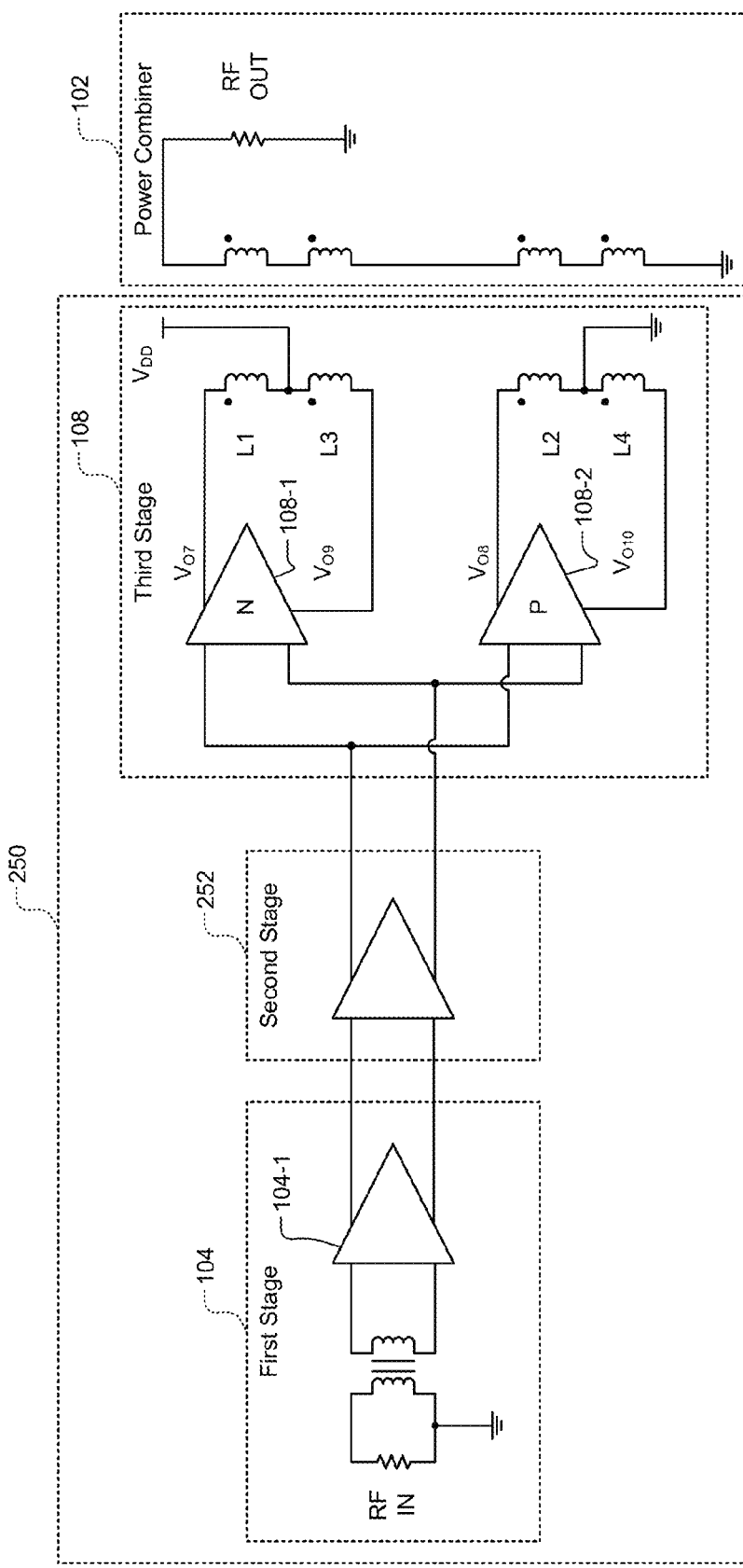
FIG. 9 is a schematic of a fourth example of the common-source power amplifier and the power combiner of FIG. 1 according to the present disclosure.

FIG. 9 shows a common-source power amplifier 250 with the power combiner 102. The common-source power amplifier 250 includes the first amplifier stage 104, a second amplifier stage 252, and the third amplifier stage 108. The second amplifier stage 252 of the common-source power amplifier 200 includes a single common-source differential amplifier. For example only, the common-source differential amplifier of the second amplifier stage 252 include NMOS transistors having a greater size than the NMOS transistors of the common-source differential amplifier 104-1 of the first amplifier stage 104. The common-source differential amplifier 104-1 of the first amplifier stage 104 drives the common-source differential amplifier of the second amplifier stage 252. The source terminals of the NMOS transistors of the common-source differential amplifier of the second amplifier stage 252 are directly connected to a common potential (e.g., ground). The common-source differential amplifier of the second amplifier stage 252 amplifies the differential outputs $V_{O1}$ and $V_{O2}$ of the common-source differential amplifier 104-1 of the first amplifier stage 104. The common-source differential amplifier of the second amplifier stage 202 generates respective differential outputs. The common-source differential amplifier of the second amplifier stage 252 drives each of the first and second common-source differential amplifiers 108-1 and 108-2 of the third amplifier stage 108.

The second amplifier stage 252 of the common-source power amplifier 250 has less linearity than the second amplifier stage 106 of the common-source power amplifier 100. However, using a single common-source differential amplifier including NMOS transistors in the common-source differential amplifier of the second amplifier stage 252 results in significant savings in chip area. Additionally, NMOS transistors are better drivers than PMOS transistors since NMOS transistors have greater transconductance than PMOS transistors.

Figure 10:
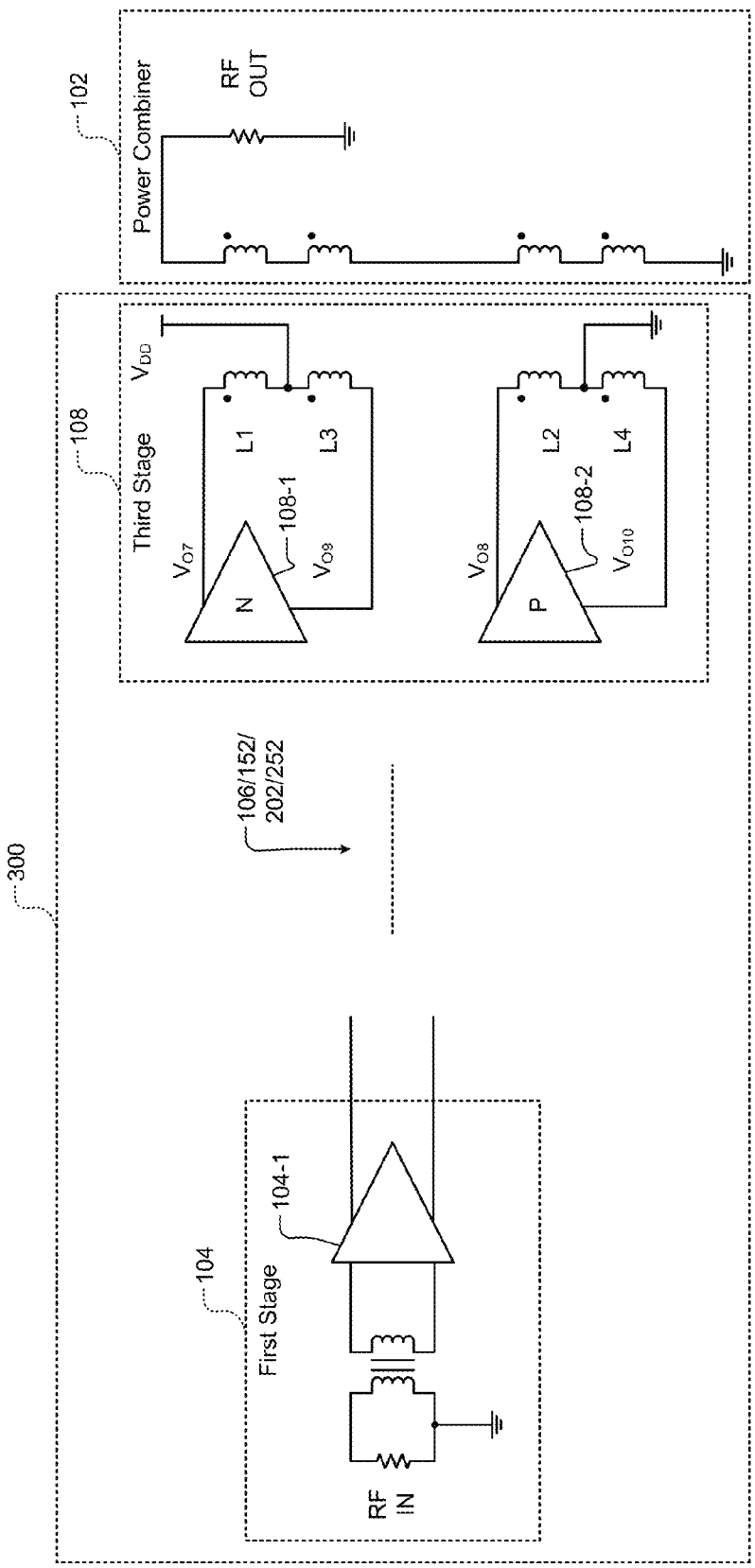
FIG. 10 is a schematic of a common-source power amplifier and a power combiner according to the present disclosure.

FIG. 10 shows a general configuration of a common-source power amplifier 300 with the power combiner 102. The common-source power amplifier 300 includes the first amplifier stage 104, one or more second amplifier stages, and the third amplifier stage 108. The one or more second amplifier stages between the first amplifier stage 104 and the third amplifier stage 108 may include one or more of any of the second amplifier stages 106, 152, 202, 252.

Figure 11:
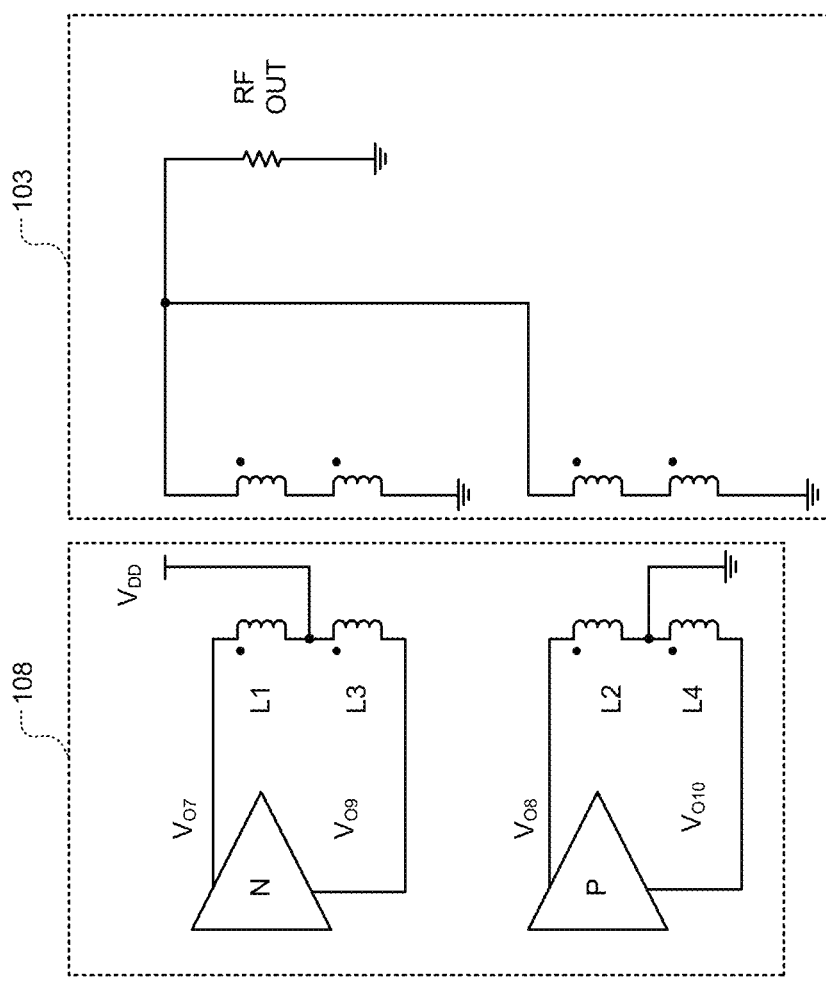
FIG. 11 is a schematic of a parallel power combiner according to the present disclosure.

FIG. 11 shows a parallel power combiner 103 that includes two pairs of inductances. In each of the two pairs of inductances, the inductances are connected in series to each other, and the pair of inductances is connected in parallel to a load and a common potential (e.g., ground) as shown. The two pairs of inductances are respectively coupled to the outputs of the first and second common-source differential amplifiers 108-1 and 108-2 of the third amplifier stage 108. The parallel power combiner 103 combines the outputs of the first and second common-source differential amplifiers 108-1 and 108-2 of the third amplifier stage 108 and delivers the combined output to a load such as an antenna as shown. The parallel power combiner 103 can be used instead of the series power combiner 102 in any of the common-source power amplifiers 100, 150, 200, 250, 300.

Figure 12:
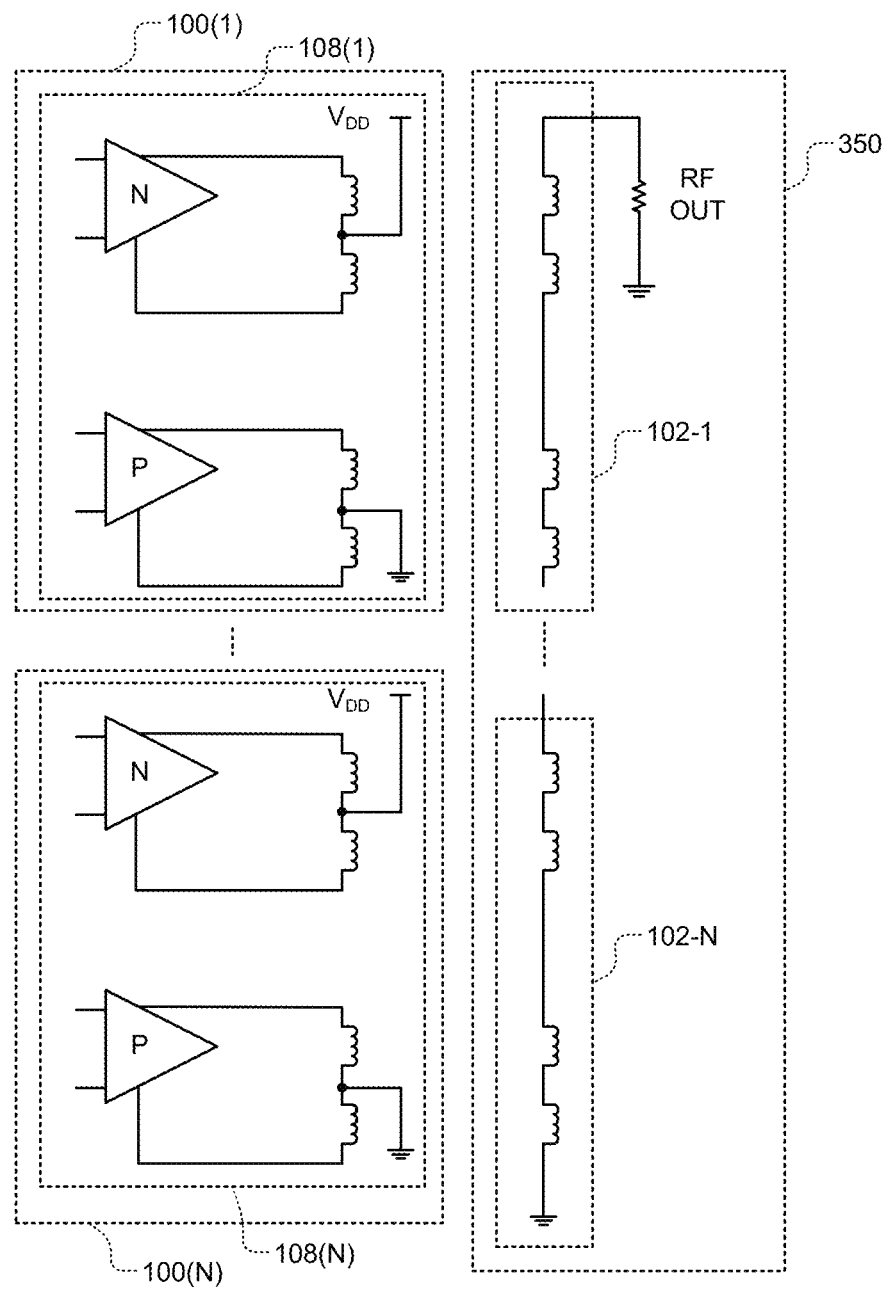
FIG. 12 is a schematic of a power combiner comprising a plurality of series power combiners configured to combine outputs of a plurality of common-source power amplifiers according to the present disclosure.
Figure 13:
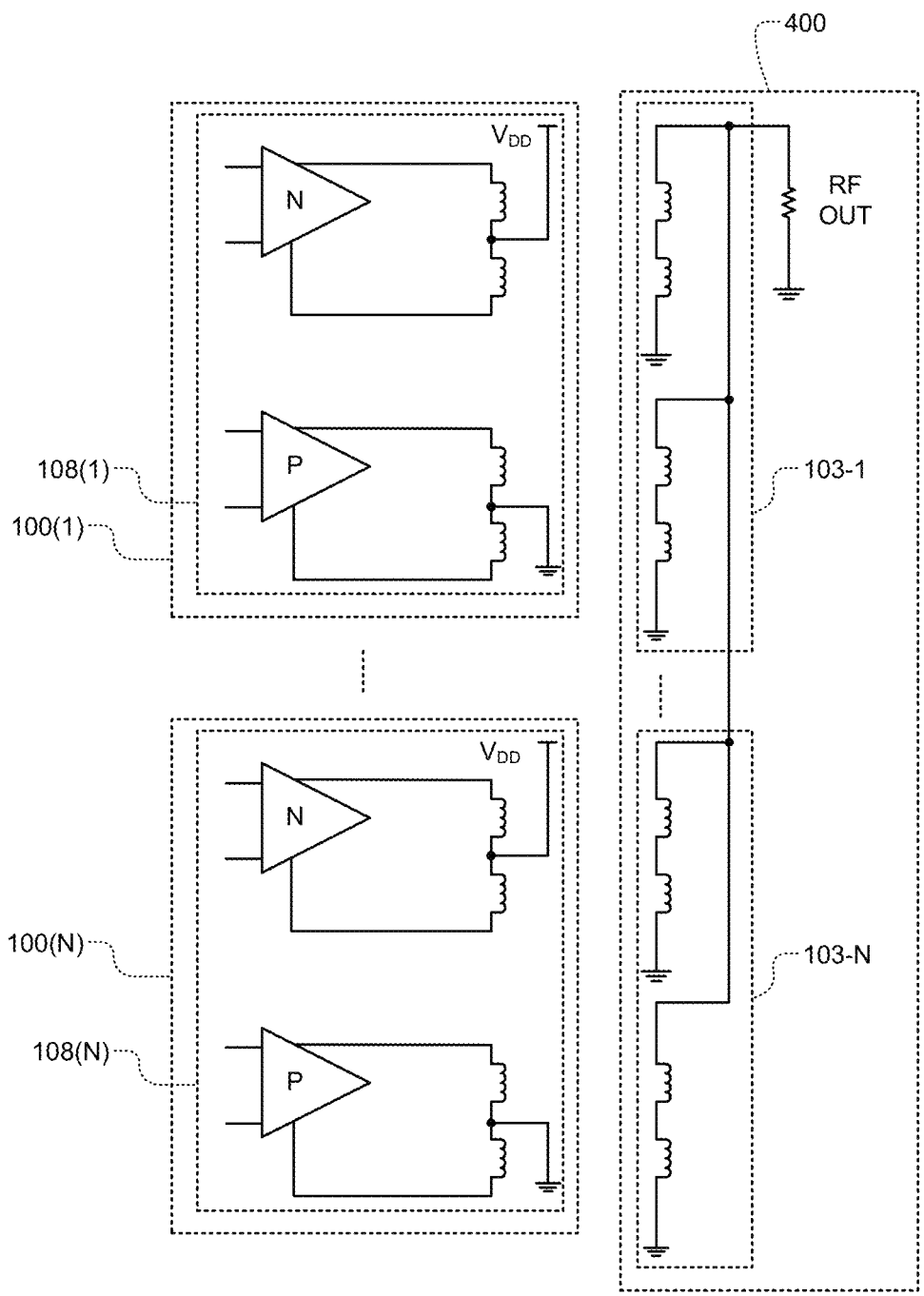
FIG. 13 is a schematic of a power combiner comprising a plurality of parallel power combiners configured to combine outputs of a plurality of common-source power amplifiers according to the present disclosure.

FIGS. 12 and 13 show additional configurations of the series and parallel power combiners. FIG. 12 shows a series power combiner 350 including a plurality of series power combiners 102-1, ..., 102-N that are connected in series to each other, where N is an integer greater than 1. The series power combiner 350 is connected across (i.e., in parallel to) a load and a common potential (e.g., ground) as shown. The series power combiner 350 combines outputs of third amplifier stages 108(1), ..., 108(N) of a plurality of common-source power amplifiers 100(1), ..., 100(N) as shown. The series power combiner 350 delivers the combined outputs of one or more of the plurality of common-source power amplifiers 100(1), ..., 100(N) to the load. The common-source power amplifiers 100(1), ..., 100(N) are shown for example only. Alternatively or additionally, any of the common-source power amplifiers 150, 200, 250, 300 may be used.

FIG. 13 shows a parallel power combiner 400 including a plurality of parallel power combiners 103-1, ..., 103-N that are connected in parallel to a load and a common potential (e.g., ground) as shown. The parallel power combiner 400 combines outputs of third amplifier stages 108(1), ..., 108(N) of a plurality of common-source power amplifiers 100(1), ..., 100(N) as shown. The parallel power combiner 400 delivers the combined outputs of one or more of the plurality of common-source power amplifiers 100(1), ..., 100(N) to the load. The common-source power amplifiers 100(1), ..., 100(N) are shown for example only. Alternatively or additionally, any of the common-source power amplifiers 150, 200, 250, 300 may be used.

Figure 14:
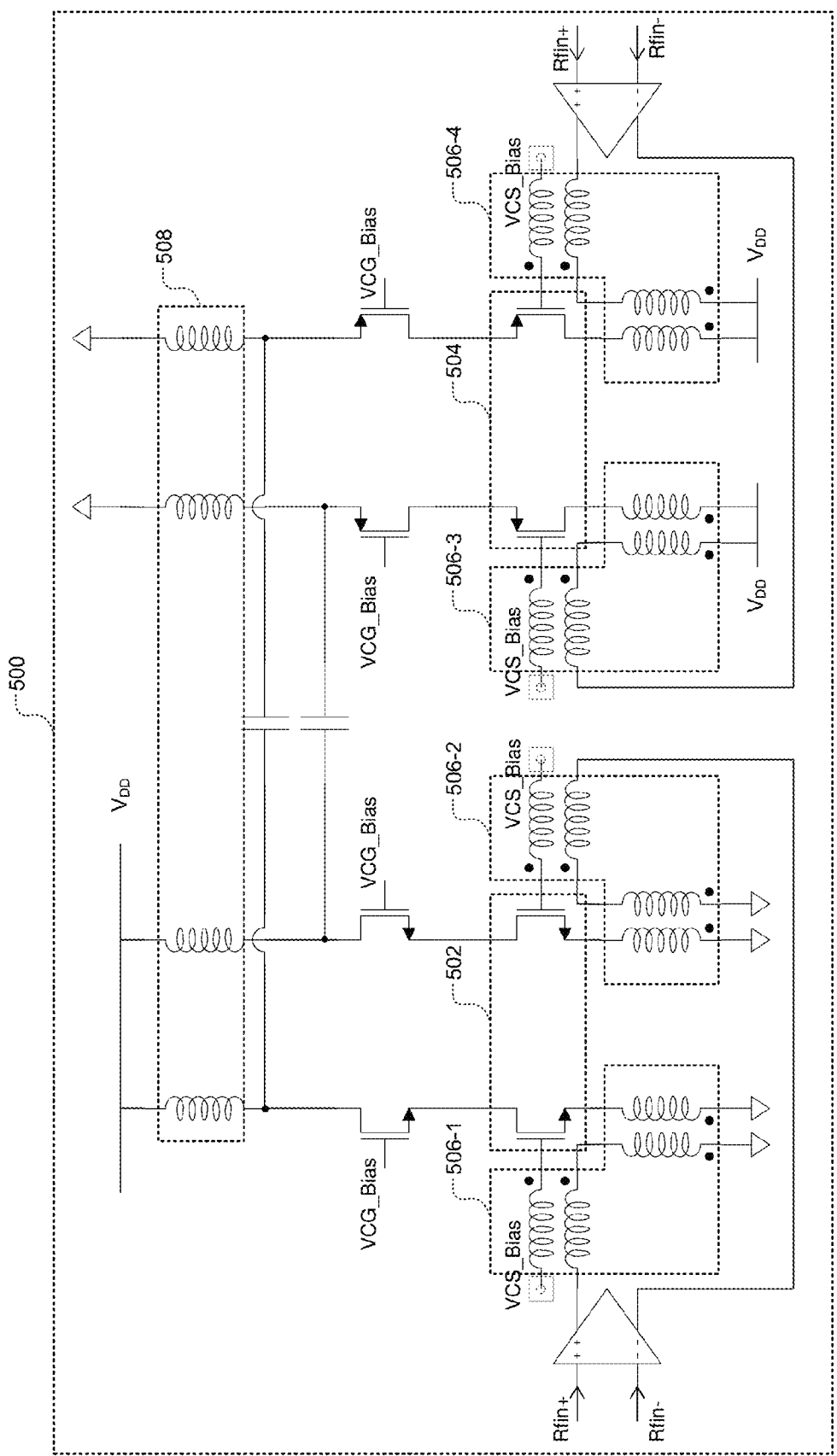
FIG. 14 is a schematic of a common-source power amplifier comprising differential pairs of NMOS and PMOS transistors and a plurality of gate-source baluns according to the present disclosure.

FIG. 14 shows a common-source power amplifier 500 including a differential pair of NMOS transistors 502; a differential pair of PMOS transistors 504; a plurality of gate-source baluns 506-1, 506-2, 506-3, and 506-4 (collectively baluns 506); and an output stage 508. The baluns 506 allow the gate-source voltages of the respective transistors to have opposite polarities, allow the source voltages to swing below ground potential (i.e., have negative voltage swings), and allow the output voltage swing across the output stage 508 of the common-source power amplifier 500 to be greater than twice the supply voltage (i.e., greater than $2V_{DD}$). The baluns 506, however, have to be implemented either externally (i.e., outside the chip comprising the common-source power amplifier 500) or as integrated passive devices (IPDs) using 3D interposers, which consume significant chip area.

Figure 15:
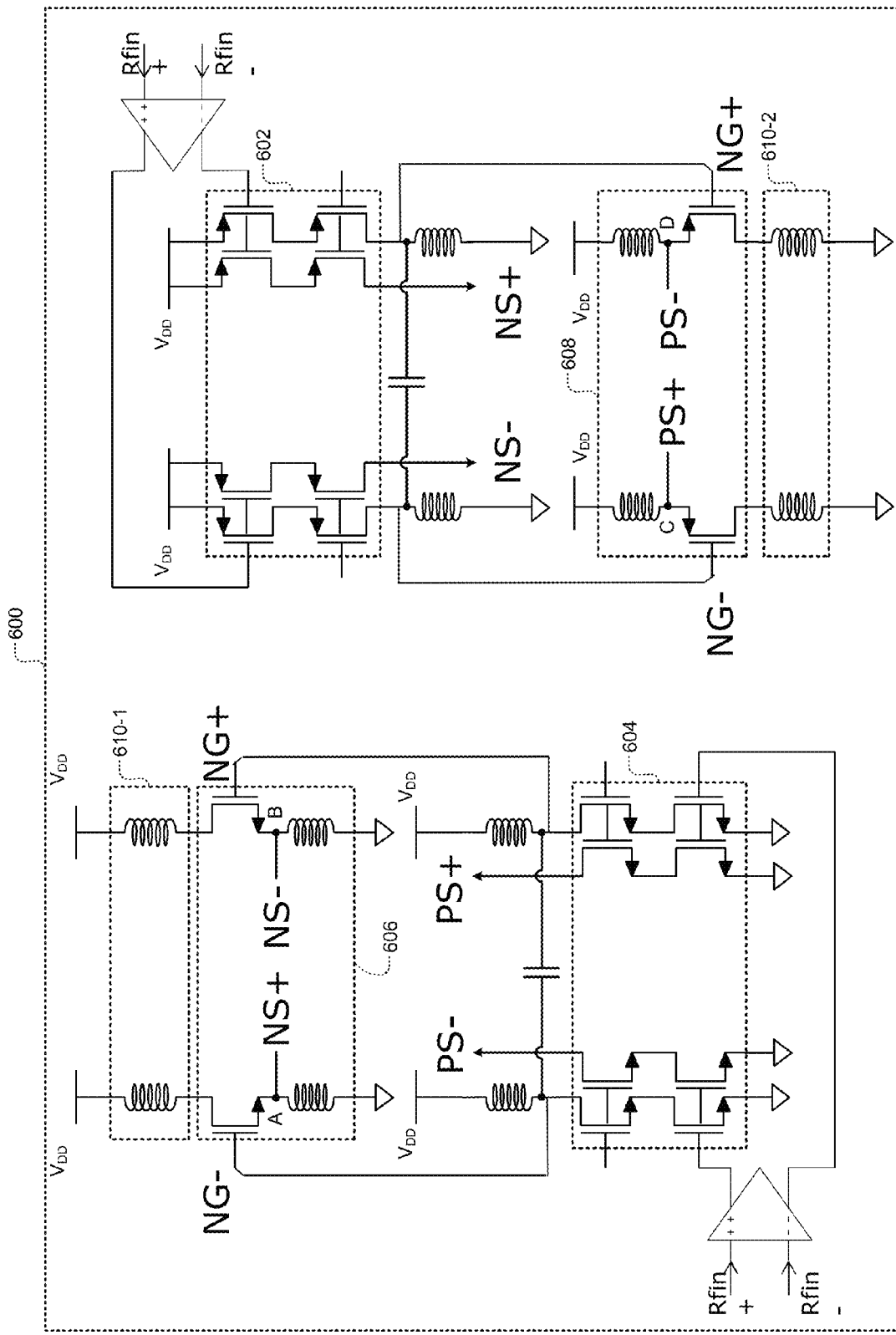
FIG. 15 is a schematic of a common-source power amplifier comprising differential pairs of NMOS and PMOS transistors driven by a plurality of PMOS and NMOS transistors according to the present disclosure.

FIG. 15 shows a common-source power amplifier 600 where the baluns 506 are replaced by active devices (e.g., NMOS and PMOS transistors) 602 and 604. Similar to the baluns 506, the active devices 602 and 604 allow the gate-source voltages of the respective transistors to have opposite polarities, allow the source voltages to swing below ground potential (i.e., have negative voltage swings), and allow the output voltage swing across the output stage (shown as 610-1 and 610-2) of the common-source power amplifier 600 to be greater than twice the supply voltage (i.e., greater than $2V_{DD}$). The opposite polarities of the gate-source voltages and the increased voltage swings are achieved by connecting the outputs NS+ and NS− of the active devices 602 respectively to nodes A and B and by connecting the outputs PS+ and PS− of the active devices 604 respectively to nodes C and D as shown.

The active devices 602 and 604 occupy less chip area than the baluns 506. Additionally, unlike the baluns 506, which cannot implement fractional turns ratios (e.g., 1:1.x or 1:1.xx, where x=1, 2, ..., 9), particularly when one of the windings has a single turn, the active devices 602 and 604 can have any desired area and therefore can implement any turns ratio of the baluns 506. By using the active devices 602 and 604, the gate baluns are entirely eliminated. Additionally, the source baluns are replaced by single source inductances. Elements 606 and 608 show the two differential pairs of transistors and respective single source inductances.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A system comprising:
   a first amplifier stage configured to amplify an input signal and generate first output signals, wherein the first amplifier stage includes a common-source differential amplifier, wherein the common-source differential amplifier includes a plurality of metal-oxide semiconductor field-effect transistors (MOSFETs) having source terminals connected to a common potential; and
   a second amplifier stage including a first differential amplifier and a second differential amplifier configured to respectively generate first and second differential outputs based on the first output signals, wherein each of the first and second differential amplifiers includes a plurality of MOSFETs having source terminals connected to the common potential via a respective balun, wherein the first and second differential amplifiers receive a supply voltage, and wherein the first and second differential outputs of the first and second differential amplifiers have an amplitude greater than twice the supply voltage.

2. The system of claim 1, further comprising a combiner configured to combine the first and second differential outputs of the first and second differential amplifiers to generate an output.

3. The system of claim 1, wherein:
   the MOSFETs of the common-source differential amplifier of the first amplifier stage include N MOSFETs;
   the MOSFETs of the first differential amplifier of the second amplifier stage include N MOSFETs; and
   the MOSFETs of the second differential amplifier of the second amplifier stage include P MOSFETs.

4. The system of claim 1, further comprising:
   a third amplifier stage configured to receive the first output signals,
   wherein the third amplifier stage includes a third differential amplifier and a fourth differential amplifier configured to respectively generate third and fourth differential outputs,
   wherein each of the third and fourth differential amplifiers includes a plurality of MOSFETs having source terminals connected to the common potential, and
   wherein the third and fourth differential outputs are respectively output to the first and second differential amplifiers of the second amplifier stage.

5. The system of claim 4, wherein:
   the MOSFETs of the common-source differential amplifier of the first amplifier stage include N MOSFETs;

the MOSFETs of the first differential amplifier of the second amplifier stage and the MOSFETs of the third differential amplifier of the third amplifier stage include N MOSFETs; and the MOSFETs of the second differential amplifier of the second amplifier stage and the MOSFETs of the fourth differential amplifier of the third amplifier stage include P MOSFETs.

6. The system of claim 4, wherein:

the MOSFETs of the common-source differential amplifier of the first amplifier stage include N MOSFETs;

the MOSFETs of the first and second differential amplifiers of the second amplifier stage and the MOSFETs of the third differential amplifier of the third amplifier stage include N MOSFETs; and the MOSFETs of the fourth differential amplifier of the third amplifier stage include P MOSFETs.

7. The system of claim 1, further comprising:

a third amplifier stage configured to receive the first output signals and generate second output signals, wherein the third amplifier stage includes a second common-source differential amplifier, wherein the second common-source differential amplifier includes a plurality of MOSFETs having source terminals connected to the common potential and having a size greater than the plurality of MOSFETs of the first amplifier stage, and wherein the second output signals are output to the first and second differential amplifiers of the second amplifier stage.

8. The system of claim 7, wherein:

the MOSFETs of the first and third amplifier stages include N MOSFETs;

the MOSFETs of the first differential amplifier of the second amplifier stage include N MOSFETs; and the MOSFETs of the second differential amplifier of the second amplifier stage include P MOSFETs.

9. The system of claim 1, further comprising:

a combiner including first and second pairs of inductances connected in series to each other, wherein the first pair of inductances is inductively coupled to the first differential output of the first differential amplifier of the second amplifier stage, and wherein the second pair of inductances is inductively coupled to the second differential output of the second differential amplifier of the second amplifier stage.

10. The system of claim 1, further comprising:

a combiner including first and second pairs of inductances, wherein the inductances of the first pair are connected in series to each other, wherein the inductances of the second pair are connected in series to each other, wherein the first pair of inductances is connected in parallel to the second pair of inductances, and wherein the first and second pairs of inductances are respectively inductively coupled to the first and second differential outputs of the first and second differential amplifiers of the second amplifier stage.

11. A method comprising:

generating a first output by amplifying an input using a first common-source amplifier having source terminals connected to a common potential; and generating a second output by amplifying the first output using a second common-source amplifier having source terminals connected to the common potential via a respective balun or active component, wherein an amplitude of the second output is greater than twice a supply voltage of the first and second common-source amplifiers.

12. The method of claim 11, further comprising:

inductively coupling the second output to a power combiner; and supplying an output of the power combiner to a load.

13. The method of claim 11, further comprising:

driving the second common-source amplifier using a third common-source amplifier, wherein the third common-source amplifier receives the first output, and wherein the third common-source amplifier has source terminals connected to the common potential.

14. The method of claim 13, wherein the third common-source amplifier includes transistors of size greater than transistors of the first common-source amplifier.

* * * * *